(12) United States Patent
Botez

(10) Patent No.: US 6,907,056 B2
(45) Date of Patent: Jun. 14, 2005

(54) SEMICONDUCTOR LIGHT SOURCES WITH DOPING GRADIENTS IN OPTICAL CONFINEMENT LAYERS FOR IMPROVED DEVICE EFFICIENCY

(75) Inventor: Dan Botez, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 110 days.

(21) Appl. No.: 10/637,894

(22) Filed: Aug. 8, 2003

(65) Prior Publication Data

US 2005/0031000 A1 Feb. 10, 2005

(51) Int. Cl.$^7$ ................................................ H01S 5/00
(52) U.S. Cl. ........................................ 372/43; 372/50
(58) Field of Search .............................. 372/75, 51, 54, 372/59, 43–50

(56) References Cited

U.S. PATENT DOCUMENTS

| | | |
|---|---|---|
| 5,036,522 A | 7/1991 | Tanguy et al. |
| 5,818,860 A | 10/1998 | Garbuzov et al. |
| 6,167,073 A | 12/2000 | Botez et al. |
| 6,195,381 B1 | 2/2001 | Botez et al. |
| 6,256,330 B1 | 7/2001 | LaComb |

OTHER PUBLICATIONS

D. Botez, et al., "66% CW wallplug efficiency from Al–free 0.98 ▯m–emitting diode lasers," Electronics Letters, vol. 32, No. 21, Oct. 10, 1996, pp. 2012–2013.

H. Yi, et al., "Optical losses of Al–free lasers for ▯=0.808 and 0.98 ▯m," Appl. Phys. Lett., vol. 69, No. 20, Nov. 11, 1996, pp. 2983–2985.

I.K. Han, et al., "Dependence of the Light–Current Characteristics of 1.55 ▯m Broad–Area Lasers on Different p–doping Profiles," IEEE Photonics Technology Letters, vol. 12, No. 3, Mar., 2000, pp. 251–253.

J.J. Lee, et al., "Asymmetric Broad Waveguide Diode Lasers (▯=980 nm) of Large Equivalent Transverse Spot Size and Low Temperature Sensitivity," IEEE Photonics Technology Letters, vol. 14, No. 8, Aug., 2002, pp. 1046–1048.

Gregory L. Belenky, et al., "Effect of p–Doping Profile on Performance of Strained Multi–Quantum–Well InGaAsP–InP Lasers," IEEE Journal of Quantum Electronics, vol. 32, No. 8, Aug., 1996, pp. 1450–1455.

*Primary Examiner*—Minsun Oh Harvey
*Assistant Examiner*—Tuan N. Nguyen
(74) *Attorney, Agent, or Firm*—Foley & Lardner LLP

(57) ABSTRACT

Semiconductor light emitting sources are formed to have a substrate, an active region layer having one or more quantum wells, optical confinement layers surrounding the active region layer, and a p-type cladding layer and an n-type cladding layer surrounding the confinement layers and the active region layer. At least one of the optical confinement layers has a region of doping therein that is formed to provide a built-in electric field in the confinement layer that is directed to cause drift of carriers toward the active region. The electric field increases the transport speed of the injected holes or electrons, thereby reducing the non-ohmic voltage drop and increasing the overall efficiency of the light emitting source.

32 Claims, 3 Drawing Sheets

SEMICONDUCTOR LIGHT SOURCES WITH DOPING GRADIENTS IN OPTICAL CONFINEMENT LAYERS FOR IMPROVED DEVICE EFFICIENCY

FIELD OF THE INVENTION

This invention pertains generally to the field of semiconductor diode lasers and amplifiers.

BACKGROUND OF THE INVENTION

Semiconductor diode lasers are formed of multiple layers of semiconductor materials. The typical semiconductor diode laser includes an n-type layer, a p-type layer and an undoped active region layer between them such that when the diode is forward biased electrons and holes recombine in the active region layer with the resulting emission of light. The layers surrounding the active layer typically have a lower index of refraction than the active layer and form cladding layers that confine the emitted light to the active layer and sometimes to adjacent layers. Semiconductor lasers may be constructed to be either edge emitting or surface emitting. In an edge emitting Fabry-Perot type semiconductor laser, crystal facet mirrors are located at opposite edges of the multi-layer structure to provide reflection of the emitted light back and forth in a longitudinal direction, generally in the plane of the layers, to provide lasing action and emission of laser light from one of the facets. Another type of device, which may be designed to be either edge emitting or surface emitting, utilizes distributed feedback structures rather then conventional facets or mirrors, providing feedback for lasing as a result of backward Bragg scattering from periodic variations of the refractive index or the gain or both of the semiconductor laser structure.

Semiconductor lasers having continuous wave (CW) power in the watt-range and narrow bandwidth, e.g., less than 2 Å full width half maximum (FWHM), would be desirable for a variety of applications. Examples include 0.894 µm diode lasers which may be used for polarizing Cs to generate spin-polarized Xe gas for magnetic resonance imaging, low-chirp pump sources for solid state lasers, and infrared spectroscopy sources for monitoring environmental gases. Conventional broad stripe ($\geq 25$ µm) semiconductor lasers used for obtaining high powers typically have a spectral width of about 20 Å FWHM or more at high drive levels and broaden further under quasi-CW operation. Significant improvements in spectral width can be obtained using distributed feedback (DFB) gratings or distributed Bragg reflectors (DBR) rather than Fabry-Perot mirror facets for optical feedback. For applications where (lateral) spatial coherence is not necessary, a broad-stripe laser with a DFB grating is apparently well suited for achieving high CW powers with narrow spectral linewidth.

A limitation is encountered with DFB lasers designed to operate at shorter wavelengths, including visible light wavelengths, in that conventional diode lasers grown on GaAs substrates, which can emit in the range of wavelengths between about 0.6 µm to 1.1 µm, generally have optical confinement layers next to the active region that contain aluminum, as well as cladding layers containing aluminum. Due to the high reactivity of aluminum (i.e., essentially instant oxidation when exposed to air), it has proven to be very difficult to make single frequency lasers of the DFB type in the foregoing wavelength range in which the grating is buried within the multi-layer semiconductor structure. Consequently, the commercially available high power, narrow linewidth lasers have been of the distributed Bragg reflector (DBR) type, in which the grating is outside of the active lasing part of the structure. However, such DBR devices suffer from the major drawback of mode hopping that occurs with increasing drive current due to changes in the lasing-region index of refraction with increasing drive power. As described in U.S. Pat. No. 6,195,381, improved high power edge emitting semiconductor lasers can be formed with a distributed feedback grating in an aluminum free section of the upper confinement layer to act upon the light generated in the active region to produce lasing action and emission of light from an edge. Such devices are well suited to be formed to provide a wide stripe and high power, in the one watt range, at various wavelengths including visible wavelengths.

A major objective in the development of high power lasers is improvement of the wallplug efficiency, that is, the light output relative to the electrical power input. See D. Botez, et al., "66% CW Wallplug Efficiency from Al-free 0.98 µm-emitting Diode Lasers," Electronics Letters, Vol. 32, No. 21, 10 Oct. 1996, pp. 2012–2013. Separate confinement heterostructure (SCH) semiconductor laser structures having relatively thick (greater than 0.5 µm) optical confinement layers display large built-in voltages, $V_0$, due to the non-ohmic voltage drop, $\Delta V_{no}$, which in large part is due to slow carrier transport, especially injected holes, in the confinement layers. $\Delta V_{no}$ is equal to $V_o - V_f$, where $V_f$ is the quasi-Fermi level difference in the active region. The non-ohmic voltage drop $\Delta V_{no}$ is a significant factor in the overall wallplug efficiency of the laser.

Another problem is encountered in SCH structures when the quantum-well active region is placed close to the n-doped cladding layer. An asymmetric SCH structure of this type is necessary for a large transverse spot size structure and especially for high power ARROW-type devices. See U.S. Pat. No. 6,167,073. In a diode laser having an asymmetric type structure, low mobility injected holes from the p-doped cladding layer which have a small diffusion length can result in poor overall injection efficiency.

SUMMARY OF THE INVENTION

In accordance with the invention, semiconductor light emitting sources that may be utilized in semiconductor diode lasers and light emitting diodes are formed to have highly efficient conversion of electrical power to light energy. Such light emitting sources are particularly suited for forming high power diode lasers of one watt CW power output or more.

The semiconductor light emitting source of the invention has a semiconductor structure which includes, in a transverse direction, a substrate, an active region layer having one or more quantum wells, an optical confinement layer and a cladding layer having p-type doping on one side of the active region, and an optical confinement layer and a cladding layer having n-type doping on the other side of the active region. At least one of the confinement layers is preferably aluminum free and has a region of doping therein that does not reach the active region. This region of doping is formed to provide a built-in electric field in the confinement layer that is directed to cause drift of carriers in the confinement layer toward the active region. The region of doping in the confinement layer may be formed in various ways, including a narrow, heavily doped layer, preferably with a constant moderately-doped region in the rest of the confinement layer, and linearly and exponentially increasing doping-level profiles. The doping terminates before the active region to leave a nominally undoped space between the doped region in the confinement-layer and the active region.

The presence of a region of p-type doping in the confinement layer between the p-type cladding layer and the active region, which provides an electric field directed toward the active region, increases the transport speed of the injected holes toward the active region, thereby reducing the non-ohmic voltage drop and increasing the overall efficiency of the light emitting source. An n-type doped region may also be provided in the confinement layer between the n-type cladding layer and the active region. The doping in the confinement layer is formed to provide an electric field that is directed from the active region toward the n-type cladding layer, thereby increasing the speed of transport of electrons toward the active region, reducing the non-ohmic voltage drop, and increasing overall efficiency.

It is found in accordance with the invention that doping optical confinement layers in this manner significantly increases the carrier (holes or electrons) transport speed without significant losses due to free-carrier absorption where the confinement layers are substantially aluminum-free. Suitable aluminum-free semiconductor materials include InGaAsP, InGaP, and GaAs.

Further objects, features and advantages of the invention will be apparent from the following detailed description when taken in conjunction with the accompanying drawings.

DETAILED DESCRIPTION OF THE INVENTION

Figure 1:
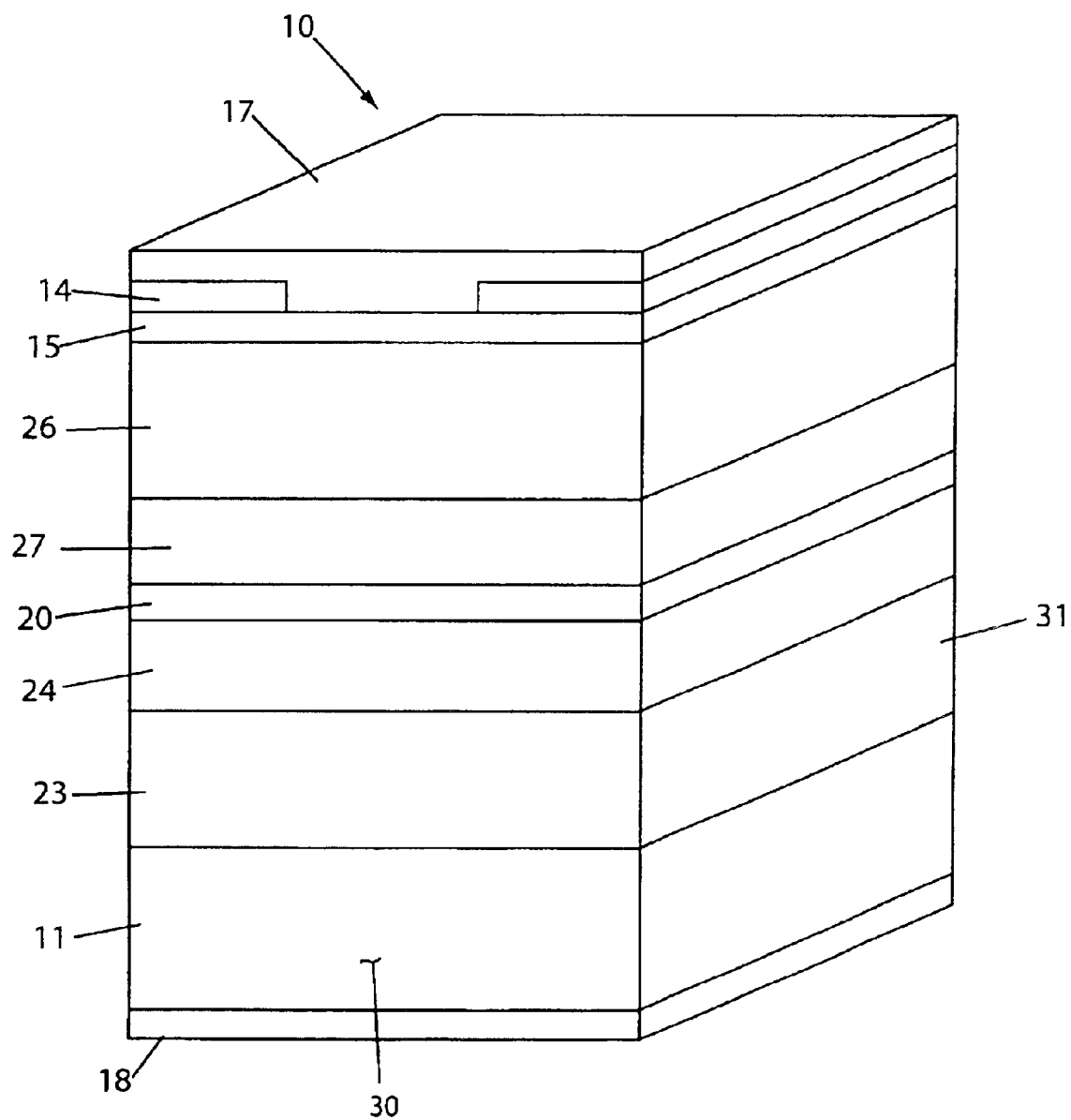
FIG. 1 is a perspective view of an exemplary semiconductor laser structure formed in accordance with the invention.
Figure 7:
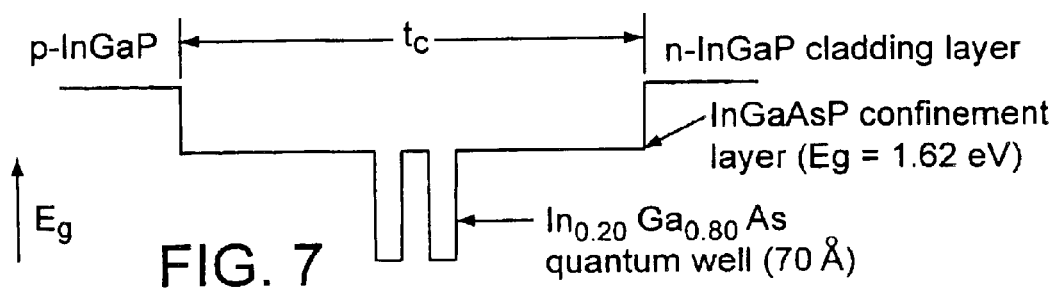
FIG. 7 is a schematic diagram of an example of a diode laser with which the present invention may be utilized.

With reference to the drawings, a simplified view of a semiconductor laser incorporating the light source of the invention is shown generally at 10 in FIG. 1. It is understood that the exemplary semiconductor laser of FIG. 1 is provided for purposes of illustrating the invention and that the laser light source of the invention may be utilized in other laser structures or LEDs. The layers illustrated in FIG. 1 are epitaxially grown on a (preferably) GaAs substrate 11. The top surface of the substrate may be the (100) surface and the epitaxial layers may be grown on the surface exactly on orientation. Current confinement may be provided in various manners. For purposes of illustration only, current confinement can be provided as in FIG. 1 by defining the emitting aperture by insulating layers 14 (e.g., of $SiO_2$) over a cap layer 15 of p+GaAs, with a top metal electrode 17 in contact with the cap layer at the top face between the insulating layer 14 to provide electrical conduction thereto. A bottom metal electrode 18 is formed on the bottom surface of the substrate 11 so that voltage may be applied across the semiconductor structure between the electrodes 17 and 18. The width of the metal electrode 17 in contact with the cap layer 15 defines the effective stripe width of the semiconductor diode in the active region layer 20 at which light emission occurs. The semiconductor light source structure also includes a lower n-type doped cladding layer 23, and a lower confinement layer 24 between the lower n-type cladding layer 23 and the active region layer 20, an upper p-type doped cladding layer 26, and an upper confinement layer 27 between the upper p-type cladding layer 26 and the active region layer 20. For utilization as a laser diode, the opposite edge faces 30 and 31 of the structure may be formed as facets, with one of the facets formed to be fully reflecting and the other to be partially reflecting so as to allow exit of light through the partially reflecting edge face. If desired, a distributed feedback grating (not shown) may be formed in the upper confinement layer 27 as described in U.S. Pat. No. 6,195,381, the disclosure of which is incorporated herein by reference. Other means for confining current to a stripe or for providing optical feedback in a laser implementation of the invention may be utilized. For example only, the semiconductor light source may be formed on a GaAs substrate having an active region with two quantum well layers of InGaAs separated by one InGaAsP barrier layer and preferably bounded by InGaAsP layers, with the optical confinement layers 24 and 27 formed of InGaAsP, and with the cladding layers 23 and 26 formed of InGaP. A schematic diagram of an example of a broad-waveguide 0.98 μm InGaAs/InGaAsP/InGaP/GaAs diode laser is shown in FIG. 7, where $t_c$ is the total optical confinement layer thickness. See D. Botez, et al., Electronics Letters, supra.

The present invention provides improved wallplug efficiency for semiconductor light sources of which the laser diode 10 of FIG. 1 is an example. The manner in which the efficiency is improved by a selected region of doping in one or both of the confinement layers in accordance with the invention is discussed below.

The expression for the maximum wallplug efficiency, $\eta_{p,max}$, is:

$$\eta_{p,\max} \cong \eta_d \frac{V_F}{V_o}(1 - 2\sqrt{R_s I_{th}/V_o}) \tag{1}$$

as long as the quantity $R_s I_{th}/V_o$ is less than or equal to 0.02, which is typically the case for diode lasers. In Eqn. (1), $\eta_d$ is the external D.Q.E., $V_F$ is the quasi-Fermi level difference, and Vo is the overall built-in voltage. The key means for improving $\eta_{p,max}$ are thus: 1) maximizing $\eta_d$, or 2) minimizing Vo.

Maximizing $\eta_d$ at room temperature can be achieved in several ways (e.g., short cavity length, low internal loss coefficient, $\alpha_i$). However, in CW operation, $\eta_d$ is a function of temperature:

$$\eta_d(T) = \eta_d(T_h)\exp\left(-\frac{\Delta T_j}{T_1}\right) \tag{2}$$

where the $T_h$ is the heatsink temperature, $\Delta T_j$ is the junction-temperature rise (i.e., $T=T_h+\Delta T_j$), and $T_1$ is the characteristic temperature coefficient for $\eta_d$. Since Vo is weakly dependent on temperature, the temperature dependence of $\eta_{p,max}$, is primarily determined by the temperature dependence of $\eta_d$.

From eqns. (1) and (2):

$$\eta_{p,\max} \sim \eta_d(T_h)\exp\left(-\frac{\Delta Tj}{T_1}\right) \quad (3)$$

The quantity $\Delta T_j$, at high drives (i.e., $I \geq 10 I_{th}$), where $\eta_{p,max}$ generally reaches its maximum, is given by:

$$\Delta T_j \approx IR_{th}[V_o + IR - V_F \eta_D(T)] \quad (4)$$

where $R_{th}$ is the thermal resistance, I is the drive current, and $R_s$ is the series resistance. To minimize the temperature dependence of $\eta_{p,max}$, one has to minimize $\Delta T_j$, as well as to maximize $T_1$. Since the $IR_s$ product, at drives where $\eta_p$ reaches its maximum, is much smaller than Vo, $\Delta T_j$, for a given Vo, is mainly a function of $R_{th}$ and $\eta_d$. Minimizing $\Delta T_j$ serves to improve $\eta_{p,max}$ (by maximizing $\eta_d$ and minimizing Vo) and thus minimizing $\Delta T_j$ is part of the overall $\eta_p$ maximization process.

As seen from eqns. (1), (2) and (3), maximizing the $T_1$ parameter is paramount for insuring as high an $\eta_{p,max}$ value as possible. $T_1$ is a function of: a) carrier leakage, and b) cavity length. More specifically, to maximize $T_1$ the carrier leakage needs to be minimized, while the cavity length needs to be shortened. These are conflicting requirements, since for short cavity lengths (<1 mm) band filling causes carrier leakage. Therefore, the challenge is to shorten the cavity to 1 mm (as required anyway for high $\eta_d$ values), while preventing carrier leakage from occurring. That can be achieved, for example, by having a multi-quantum-well (MQW) active region. The price to pay, i.e., an increase in the threshold current, $I_{th}$, is rather small, since the $I_{th}$ value has a small impact on the $\eta_{p,max}$ value [see eqn. (1)].

Thus, devices of high $T_1$ values (i.e., $T_1 > 1000K$) are required for high CW wallplug efficiency. That can be achieved by using short cavities (<1 mm) with negligible carrier leakage (e.g., the use of MQWs).

Vo is a built-in voltage which contains $V_F$ and a non-ohmic voltage drop which is denoted as $\Delta V_{no}$:

$$\Delta V_{no} = V_o - V_F \quad (5)$$

$\Delta V_{no}$ can be reduced by grading the interfaces, as proven for Al-containing devices, making graded-index SCH (GRIN-SCH) waveguide devices, and/or narrowing a standard SCH waveguide.

The GRIN-SCH option, while successful for Al-containing devices, is not practical to implement for the Al-free devices required for high $\eta_p$. The main reason is that high-quality InGaAsP of continuously-graded composition cannot be obtained, because for bandgaps in the 1.6–1.8 eV range there is a miscibility gap that results in poor-quality material. Narrowing the SCH waveguide comes at an increase in $\alpha_i$, caused in Al-free devices by both interface problems and free-carrier absorption in the cladding layers.

Figure 2:
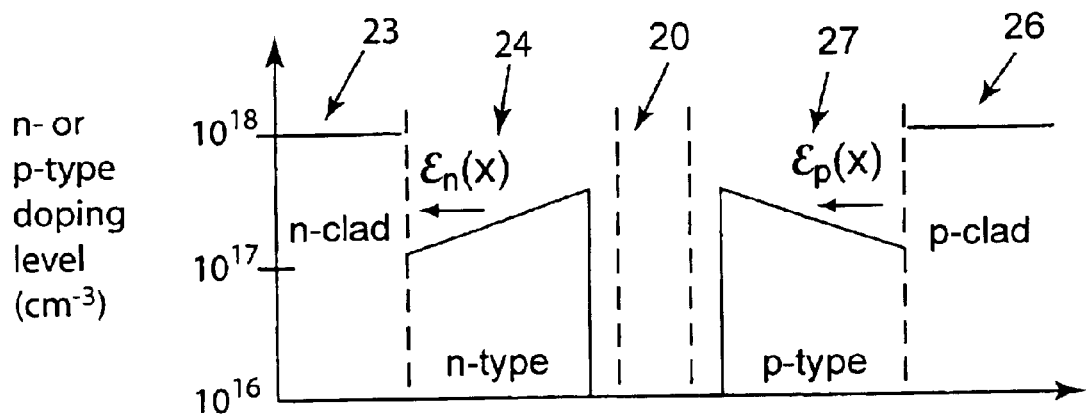
FIG. 2 is a graph illustrating an example of a region of confinement layer doping in a semiconductor light source in accordance with the invention.

Thus, a broad-waveguide (~1 μm thick) SCH structure is preferred, to keep $\eta_d$ high, while lowering $\Delta V_{no}$. Since $\Delta V_{no}$ is a non-ohmic voltage drop, it is in large part related to carrier transport in the SCH waveguide structure. In accordance with the invention, to significantly reduce the transit times of the carriers from the cladding layers to the QWs, regions of graded-doping profiles in the confinement layers of the SCH waveguide region are used. An example of a graded doping profile is shown in FIG. 2 which has regions of doping in both confinement layers 24 and 27 that increase linearly in doping level toward the active region layer 20, causing drift for both types of injected carriers. The doping region is p-type (e.g., with zinc, magnesium or beryllium dopants) in the confinement layer 27 between the active region layer 20 and the p-type cladding layer 26, and the doping region is n-type (e.g., with a silicon or tellurium dopant) between the active region and the n-type cladding layer 23.

In present commercial devices, the waveguide region in SCH devices is nominally undoped or partially low doped ($\approx 10^{17}/cm^3$) in regions far from the active layer. This is a feature left over from AlGaAs-based devices, for which free-carrier absorption is a strong function of doping level. However, in Al-free materials the free-carrier absorption is significantly reduced as compared to AlGaAs-based devices. Therefore, moderate doping of the waveguide is acceptable.

If the doping is graded in an n-type material, an electric field is created:

$$\varepsilon_n(x) = -\frac{kT}{q}\frac{dn(x)/dx}{n(x)} \quad (6)$$

where n(x) is the n-type doping concentration variation in the direction x; k is the Boltzmann constant, T is the absolute temperature, and q is the electron charge. At room temperature kT/q is equal to 0.026 V. In our case x is the direction transverse to the layers of the semiconductor structure.

If the doping level increases from the n-clad layer to the active region, as shown in FIG. 2, an electric field is created which causes injected-electron drift, and thus a much faster transit time (to the QWs) than in conventional SCH devices.

If the doping is graded in a p-type material, the created electric field is:

$$\varepsilon_p(x) = \frac{kT}{q}\frac{dp(x)/dx}{p(x)} \quad (7)$$

where p(x) is the p-type doping concentration variation in the transverse direction x; kT/q is the same as defined for Eqn. (6).

If the doping increases from the p-clad layer to the active region, as shown in FIG. 2, the created electrical field will cause injected-hole drift, and subsequent faster transmit time (to the QWs) than in conventional SCH structures. Examples of doping gradients for the structure of FIG. 2 are from $5 \times 10^{17}$ cm$^{-3}$ adjacent to (but spaced from) the active region layer 20 to $1 \times 10^{17}$ cm$^{-3}$ at the interfaces between the confinement layers and the cladding layer. Such doping gradients not only lower Vo, but also help to significantly reduce carrier leakage (and thus increase $T_1$).

Figure 3:
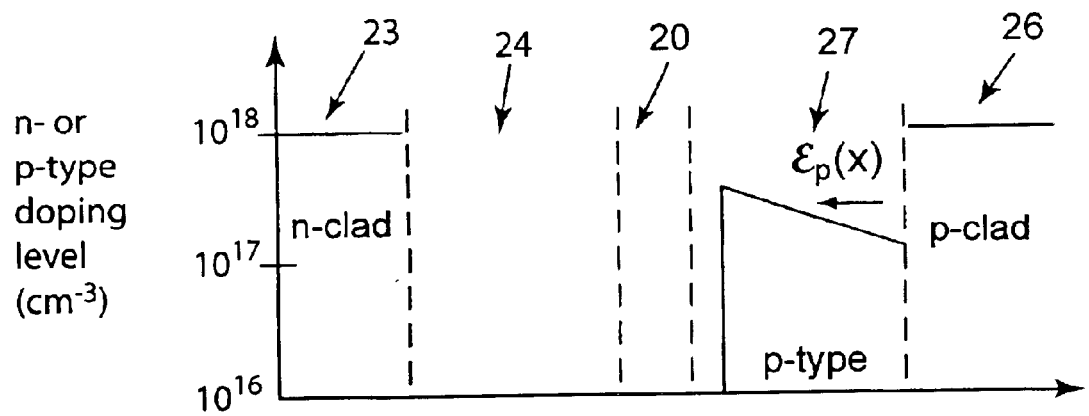
FIG. 3 is a graph of another example of a region of confinement layer doping in a semiconductor light source.
Figure 4:
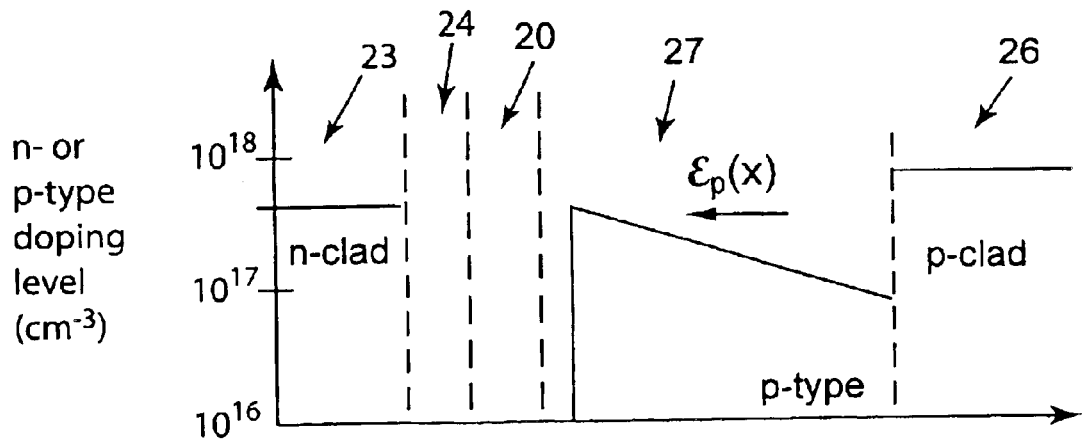
FIG. 4 is a graph of another example of a region of confinement layer doping in a semiconductor light source.
Figure 5:
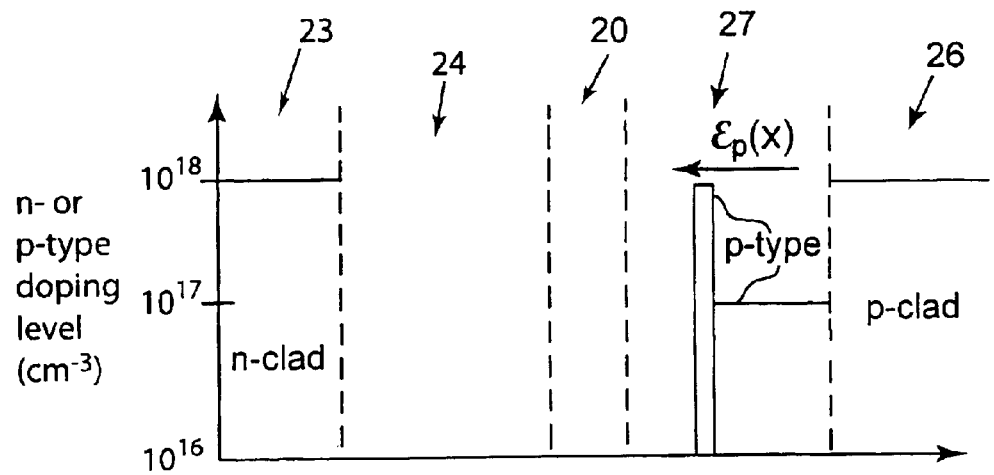
FIG. 5 is a graph of another example of a region of confinement layer doping in a semiconductor light source.
Figure 6:
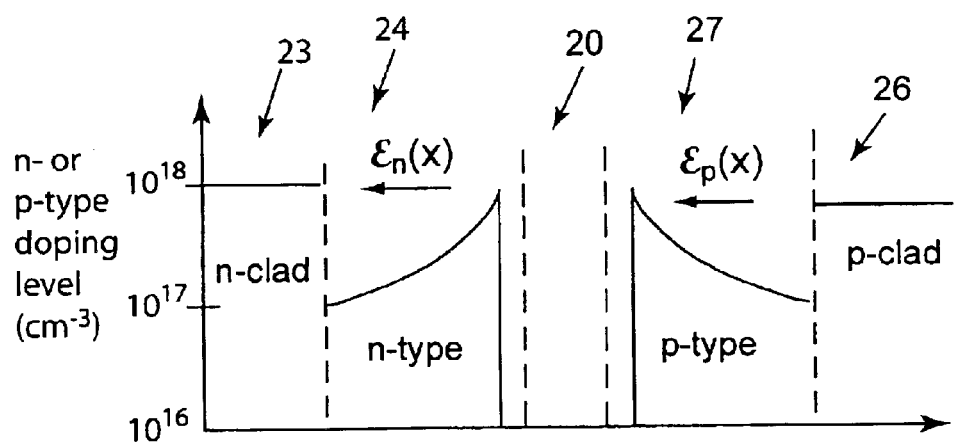
FIG. 6 is a graph of another example of a region of confinement layer doping in a semiconductor light source.

Further examples of doping profiles for doped regions in the confinement layer(s) are shown in FIGS. 3–6. FIG. 3 illustrates another doping profile in accordance with the invention in which only the confinement layer 27 adjacent to the p-type cladding layer 26 has (linearly increasing) doping therein. FIG. 4 shows a similar doping gradient but for an asymmetrically positioned active region layer 20. Such asymmetric structures may be formed as described in U.S. Pat. No. 6,167,073 and J. J. Lee, L. J. Mawst and D. Botez, "Asymmetric Broad Waveguide Diode Lasers (λ=980 nm) of Large Equivalent Transverse Spot Size and Low Temperature Sensitivity," IEEE Photonics Technology Letters, Vol. 14, No. 8, Aug., 2002, pp. 1046–1048. It may be noted that the built-in voltage drop in the confinement layer(s) depends only on the doping levels at the edges of the doped region. Thus, any gradient profile can be used, not just linear gradients as shown in FIGS. 2–4. FIG. 5 illustrates such a non-linear gradient doping region configuration in which a thin layer (e.g., 100–300 Å and preferably about 200 Å) in the confinement layer 27 is heavily doped to, e.g., $5 \times 10^{17}/\text{cm}^3$ or higher, with the rest of the confinement layer preferably being doped (e.g., p-type for the layer 27) at a constant lower level (e.g., $1 \times 10^{17}/\text{cm}^3$). FIG. 6 illustrates another doping configuration in which the doping profiles are exponentially increasing rather than linearly increasing. Such doping profiles are shown for illustration only, and other profiles may be utilized within the scope of the invention which similarly provide electric fields that speed carrier transport through one or both of the confinement layers.

It is understood that the invention is not confined to the embodiments set forth herein, but embraces all such forms thereof as come within the scope of the following claims.

What is claimed is:

1. A semiconductor light emitting source comprising:
   (a) a semiconductor structure including in a transverse direction a substrate, a layer with an active region having one or more quantum wells, an optical confinement layer and a cladding layer having p-type doping on one side of the active region layer and an optical confinement layer and a cladding layer having n-type doping on another side of the active region layer; and
   (b) at least one of the optical confinement layers having a region of doping therein that does not reach the active region and that is formed to provide a built-in electric field in the optical confinement layer that is directed to cause drift of carriers in the confinement layer toward the active region.

2. The semiconductor light source of claim 1 wherein the optical confinement layer having a region of doping is between the p-type cladding layer and the active region and wherein the region of doping therein is p-type and is formed to provide an electric field in a direction from the p-type cladding layer toward the active region layer.

3. The semiconductor light source of claim 2 wherein the optical confinement layer having a region of doping is aluminum free.

4. The semiconductor light source of claim 3 wherein the region of doping in the optical confinement layer comprises a narrow layer that is heavily p-type doped.

5. The semiconductor light source of claim 4 wherein the optical confinement layer with the region of doping also has a lower constant level of p-type doping.

6. The semiconductor light source of claim 3 wherein the region of doping in the optical confinement layer comprises a level of p-type doping that increases in a direction from the p-type cladding layer toward the active region.

7. The semiconductor light source of claim 3 wherein the region of doping in the optical confinement layer comprises an exponentially increasing level of doping in a direction from the p-type cladding layer toward the active region.

8. The semiconductor light source of claim 1 wherein the p-type dopant in the doped region of the optical confinement layer is selected from the group consisting of zinc, magnesium, and beryllium.

9. The semiconductor light source of claim 1 wherein the optical confinement layer having a region of doping is between the n-type cladding layer and the active region and wherein the region of doping therein is n-type and is formed to provide an electric field in a direction from the active region toward the n-type cladding layer.

10. The semiconductor light source of claim 9 wherein the optical confinement layer having a region of doping is aluminum free.

11. The semiconductor light source of claim 10 wherein the region of doping in the optical confinement layer comprises a narrow layer that is heavily n-type doped.

12. The semiconductor light source of claim 11 wherein the optical confinement layer with the region of doping thereon also has a lower constant level of p-type doping.

13. The semiconductor light source of claim 10 wherein the region of doping in the optical confinement layer comprises a level of n-type doping that increases in a direction from the n-type cladding layer toward the active region.

14. The semiconductor light source of claim 10 wherein the region of doping in the optical confinement layer comprises an exponentially increasing level of doping in a direction from the n-type cladding layer toward the active region.

15. The semiconductor light source of claim 10 wherein the n-type dopant in the doped region of the optical confinement layer is selected from the group consisting of silicon and tellurium.

16. The semiconductor light source of claim 1 wherein the active region includes one or more quantum wells of InGaAs bounded by InGaAsP layers and wherein the confinement layers are formed of InGaAsP.

17. An edge emitting semiconductor laser comprising:
   (a) a semiconductor structure including in a transverse direction a substrate, a layer with an active region having one or more quantum wells, an optical confinement layer and a cladding layer having p-type doping on one side of the active region layer and an optical confinement layer and a cladding layer having n-type doping on another side of the active region layer, and electrodes by which voltage can be applied across the semiconductor structure;
   (b) at least one of the optical confinement layers having a region of doping therein that does not reach the active region and that is formed to provide a built-in electric field in the optical confinement layer that is directed to cause drift of carriers in the confinement layer toward the active region;
   (c) means for confining the current from the electrodes to a stripe region; and
   (d) means for providing optical feedback to provide lasing action in the active region layer.

18. The semiconductor laser of claim 17 wherein the optical confinement layer having a region of doping is between the p-type cladding layer and the active region and wherein the region of doping therein is p-type and is formed to provide an electric field in a direction from the p-type cladding layer toward the active region layer.

19. The semiconductor light source of claim 18 wherein the optical confinement layer having a region of doping is aluminum free.

20. The semiconductor laser of claim 19 wherein the region of doping in the optical confinement layer comprises a narrow layer that is heavily p-type doped.

21. The semiconductor laser of claim 20 wherein the optical confinement layer with the region of doping also has a lower constant level of p-type doping.

22. The semiconductor laser of claim 19 wherein the region of doping in the optical confinement layer comprises a level of p-type doping that increases in a direction from the p-type cladding layer toward the active region.

23. The semiconductor laser of claim 19 wherein the region of doping in the optical confinement layer comprises an exponentially increasing level of doping in a direction from the p-type cladding layer toward the active region.

24. The semiconductor laser of claim 19 wherein the p-type dopant in the doped region of the optical confinement layer is selected from the group consisting of zinc, magnesium, and beryllium.

25. The semiconductor laser of claim 17 wherein the optical confinement layer having a region of doping is between the n-type cladding layer and the active region and wherein the region of doping therein is n-type and is formed to provide an electric field in a direction from the active region toward the n-type cladding layer.

26. The semiconductor of claim 25 wherein the optical confinement layer having a region of doping is aluminum free.

27. The semiconductor laser of claim 26 wherein the region of doping in the optical confinement layer comprises a narrow layer that is heavily n-type doped.

28. The semiconductor laser of claim 27 wherein the optical confinement layer with the region of doping thereon also has a lower constant level of n-type doping.

29. The semiconductor laser of claim 26 wherein the region of doping in the optical confinement layer comprises a level of n-type doping that increases in a direction from the n-type cladding layer toward the active region.

30. The semiconductor laser of claim 26 wherein the region of doping in the optical confinement layer comprises an exponentially increasing level of doping in a direction from the n-type cladding layer toward the active region.

31. The semiconductor laser of claim 26 wherein the n-type dopant in the doped region of the optical confinement layer is selected from the group consisting of silicon and tellurium.

32. The semiconductor laser of claim 17 wherein the active region includes one or more quantum wells of InGaAs bounded by InGaAsP layers and wherein the confinement layers are formed of InGaAsP.

* * * * *